(12) United States Patent
Gupta et al.

(10) Patent No.: US 12,451,878 B2
(45) Date of Patent: Oct. 21, 2025

(54) HIGH-VOLTAGE BIDIRECTIONAL FIELD EFFECT TRANSISTOR

(71) Applicant: Wisconsin Alumni Research Foundation, Madison, WI (US)

(72) Inventors: Chirag Gupta, Madison, WI (US); Shubhra S. Pasayat, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 359 days.

(21) Appl. No.: 18/058,453

(22) Filed: Nov. 23, 2022

(65) Prior Publication Data

US 2024/0171169 A1    May 23, 2024

(51) Int. Cl.
| | |
|---|---|
| H03K 17/0412 | (2006.01) |
| H03K 17/687 | (2006.01) |
| H10D 30/01 | (2025.01) |
| H10D 30/67 | (2025.01) |
| H10D 62/10 | (2025.01) |
| H10D 62/83 | (2025.01) |
| H03K 17/689 | (2006.01) |
| H03K 17/693 | (2006.01) |

(52) U.S. Cl.
CPC ... *H03K 17/04123* (2013.01); *H03K 17/6874* (2013.01); *H10D 30/01* (2025.01); *H10D 30/6733* (2025.01); *H10D 62/115* (2025.01); *H10D 62/8303* (2025.01); *H03K 2017/6878* (2013.01); *H03K 17/689* (2013.01); *H03K 17/693* (2013.01)

(58) Field of Classification Search
CPC ....... H03K 17/6874; H03K 2017/6878; H10D 30/6733; H10D 64/112; H10D 62/115
See application file for complete search history.

(56) References Cited

U.S. PATENT DOCUMENTS

| | | | |
|---|---|---|---|
| 2011/0026285 A1 | 2/2011 | Kawashima et al. | |
| 2012/0018735 A1 | 1/2012 | Ishii | |
| 2013/0293256 A1* | 11/2013 | Banerjee | G11C 17/18 324/762.01 |
| 2019/0386139 A1* | 12/2019 | Kaya | H10D 64/27 |
| 2020/0227545 A1 | 7/2020 | Then et al. | |
| 2023/0062747 A1* | 3/2023 | Gu | H10D 62/134 |

FOREIGN PATENT DOCUMENTS

| | | |
|---|---|---|
| CN | 114586176 A | 6/2022 |
| JP | 2010172067 A | 8/2010 |

OTHER PUBLICATIONS

Mohammad Wahidur Rahman et al.; "Integration of high permittivity BaTiO3 with AlGaN/GaN for near-theoretical breakdown field kV-class transistors." Applied Physics Letters 119, No. 19 (Oct. 2021).
International Search Report for PCT/US2023/036988.

* cited by examiner

*Primary Examiner* — Wasiul Haider
(74) *Attorney, Agent, or Firm* — Boyle Fredrickson, S.C.

(57) ABSTRACT

A bidirectional FET switch combining gate elements greatly reduces chip area and cost through the use of a dielectric layer with a high dielectric constant of a complex oxide moderating peak electrical gradients when used with or without field plates.

20 Claims, 4 Drawing Sheets

HIGH-VOLTAGE BIDIRECTIONAL FIELD EFFECT TRANSISTOR

STATEMENT REGARDING FEDERALLY SPONSORED RESEARCH OR DEVELOPMENT

- - -

CROSS REFERENCE TO RELATED APPLICATION

- - -

BACKGROUND OF THE INVENTION

The present invention relates to high-voltage solid-state devices, for example, useful for motor drives, and in particular to a high-voltage bidirectional FET architecture.

Power semiconductors, such as field-effect transistors (FETs), find use in a variety of power conversion circuits such as matrix converters, cyclo-converters, and current source inverters, where they synthesize AC waveforms, for example, that may be used for driving motors or the like. Such circuits may use bidirectional switching elements that can controllably block or conduct current in either of two polarities.

Bidirectional FET switching elements are commonly fabricated using two FET devices, for example, oriented with opposite polarities and connected in series. Each device is shunted by a diode to steer current to the FET of proper polarity according to the direction of current flow resulting from the polarity of voltage applied to the switching element.

High-voltage FET devices require that the electric field gradient (volts per centimeter) experienced along the channel be limited in order to maintain control of the channel current by the gate field-effect. This limit in electrical field gradient is enforced by the mechanisms of: (1) increasing the separation between the drain and source such as reduces the peak gradient proportionally and (2), the use of field plates tied to the source terminal and positioned between the drain and source to suppress peak electrical gradients.

As the voltage rating of the bidirectional FET device increases, the distance between the terminals of the bidirectional FET must increase by twice that proportion of the voltage increase as a result of corresponding increases in both of the two FET devices making up the bidirectional FET. The cost and complexity of the field plates, which may comprise as much as 10% of the device fabrication costs, also increase with rising voltage rating. These disproportionate increases in fabrication costs for bidirectional FETs practically limit the availability of such devices for many high-voltage applications.

SUMMARY OF THE INVENTION

The present invention employs a complex oxide dielectric material positioned along the FET channel to substantially reduce the device size in bidirectional FET designs and thus make higher-voltage bidirectional FETs economically viable.

In one embodiment, the invention provides a bidirectional field-effect transistor having a semiconductor channel positioned between device terminals providing current flow through the channel and at least one field-effect gate positioned along the semiconductor channel between the device terminals to control current between the device terminals through the channel by a field-effect. Each the at least one field-effect gate is positioned to so that all gates of the bidirectional field-effect transistor are mirror symmetric between the device terminals and a dielectric oxide having a dielectric constant of greater than 50 is along and adjacent to the channel operative to moderate field gradients.

It is thus a feature of at least one embodiment of the invention to overcome the disproportional costs of a high-voltage bidirectional FET by moderating voltage gradient peaks through the use of a high dielectric layer allowing more compact structures.

The dielectric may be positioned between the at least one gate and the channel.

It is thus a feature of at least one embodiment of the invention to provide a simple method of integrating a high dielectric material into a FET architecture.

The bidirectional field-effect transistor may further include at least one field plate separated from the channel by the dielectric oxide.

It is thus a feature of at least one embodiment of the invention to combine a high dielectric material with field plates to improve the operation of high-voltage FET bidirectional devices.

The field plate may be at least partially surrounded by the dielectric oxide.

It is thus a feature of at least one embodiment of the invention to moderate the edge effects of the field plate.

The bidirectional field-effect transistor may be held in an insulating package and wherein each of the gates, field plates, and device terminals of the channel may electrically communicate through the insulating package to electrically separate external terminals.

It is thus a feature of at least one embodiment of the invention to allow external control of the field plates, for example, to tailor the device to different voltage levels.

These particular objects and advantages may apply to only some embodiments falling within the claims and thus do not define the scope of the invention.

DETAILED DESCRIPTION OF THE PREFERRED EMBODIMENT

Figure 1:
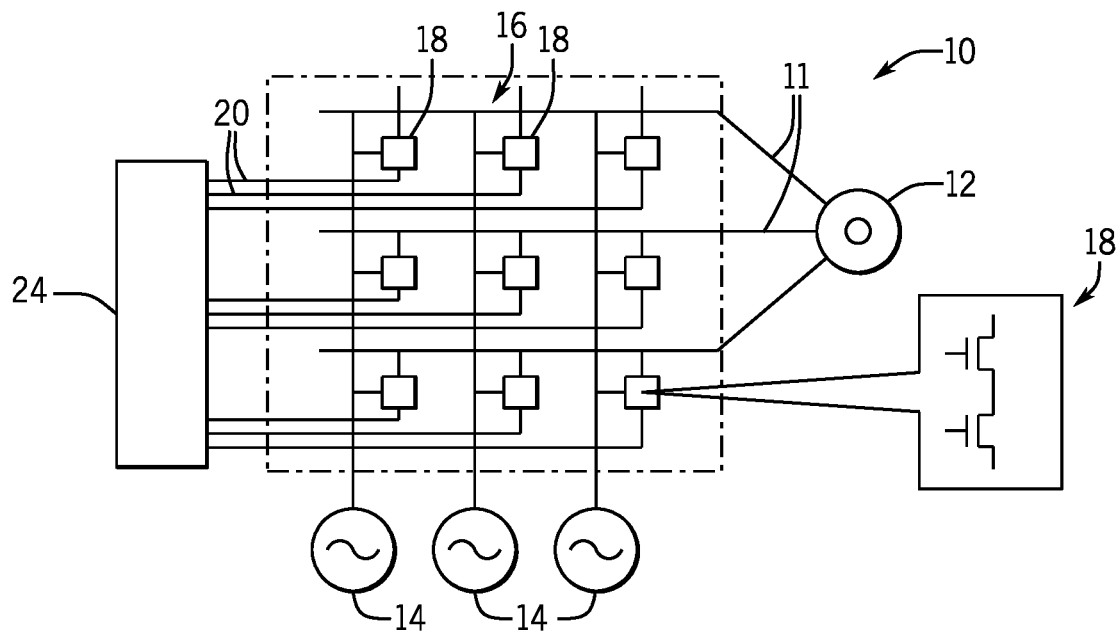
FIG. 1 is a simplified architecture of a matrix power converter used to convert a three-phase AC signal to three-phase motor drive currents that can employ the bidirectional semiconductor switching circuitry of the present invention having bidirectional semiconductor switches.

Referring now to FIG. 1, an example circuit architecture suitable for use in the present invention provides a matrix power converter 10 of the type providing three-phase output power 11 to a motor 12. The three-phase output power 11 may be synthesized from three-phase input power 14 by using a matrix 16 of bidirectional semiconductor switches 18 each providing a switchable bidirectional interconnection between each of the three phases of input current to each of the three phases of output power 11 to the motor 12. Each bidirectional semiconductor switch 18 may receive a control signal 20 from a controller 24 to controllably switch the bidirectional semiconductor switch 18 on or off while the bidirectional semiconductor switch 18 is subject to different (opposite) voltage polarities. In this regard, each of the bidirectional semiconductor switches 18 must be able to conduct current in both voltage polarities and to block current in both voltage polarities.

Generally, the control signals 20 may be developed by known techniques by controller 24 so that the synthesized waveform of the output power 11 may differ in phase, amplitude, and frequency from the three-phase input power 14. A matrix power converter 10 per the invention may operate to provide output AC waveforms having an amplitude in excess of 100 V at average currents in excess of one ampere and suitable for use with motors of one horsepower or more.

Figure 2:
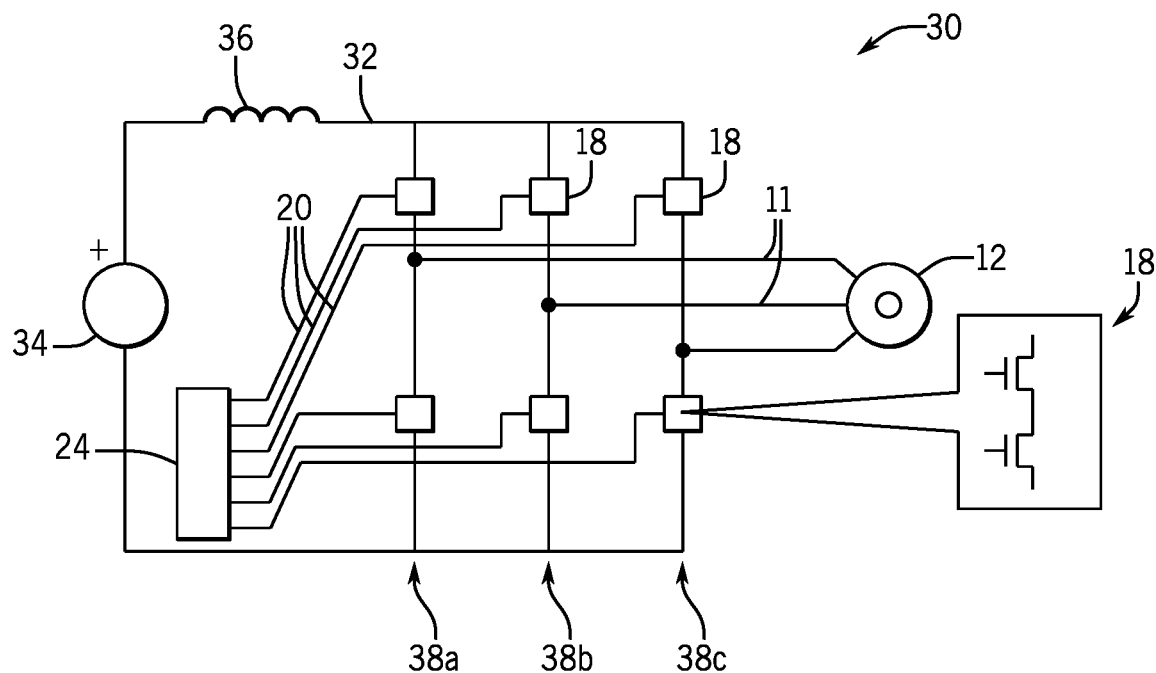
FIG. 2 is a figure similar to that of FIG. 1 showing a current source converter for converting a DC source to three-phase motor drive currents such as is also suitable for use with the bidirectional semiconductor switching circuitry of the present invention.

Referring now to FIG. 2, a second example circuit provides for a current source inverter 30 receiving DC power 32, for example, implemented by a DC voltage source 34 in series with an inductor 36. The DC power 32 is applied across a set of half bridge elements 38a 38b and 38c each consisting of a pair of series-connected bidirectional semiconductor switches 18 spanning the DC power 32 and, at their junction, providing one phase of the output power 11 to the motor 12. Again each of the bidirectional semiconductor switches 18 may receive a control signal 20 from the controller 24 to provide the desired synthesis of the output three-phase output power 11 according to a timing sequence generally understood in the art.

Circuits suitable for the controllers 24 are described, for example, in co-pending U.S. provisional application Ser. No. 63/378,301 filed Oct. 4, 2022, entitled: High-Efficiency Drive Circuit and Bidirectional FET, assigned to the assignee of the present invention and hereby incorporated by reference.

Figures 3A, 3B:
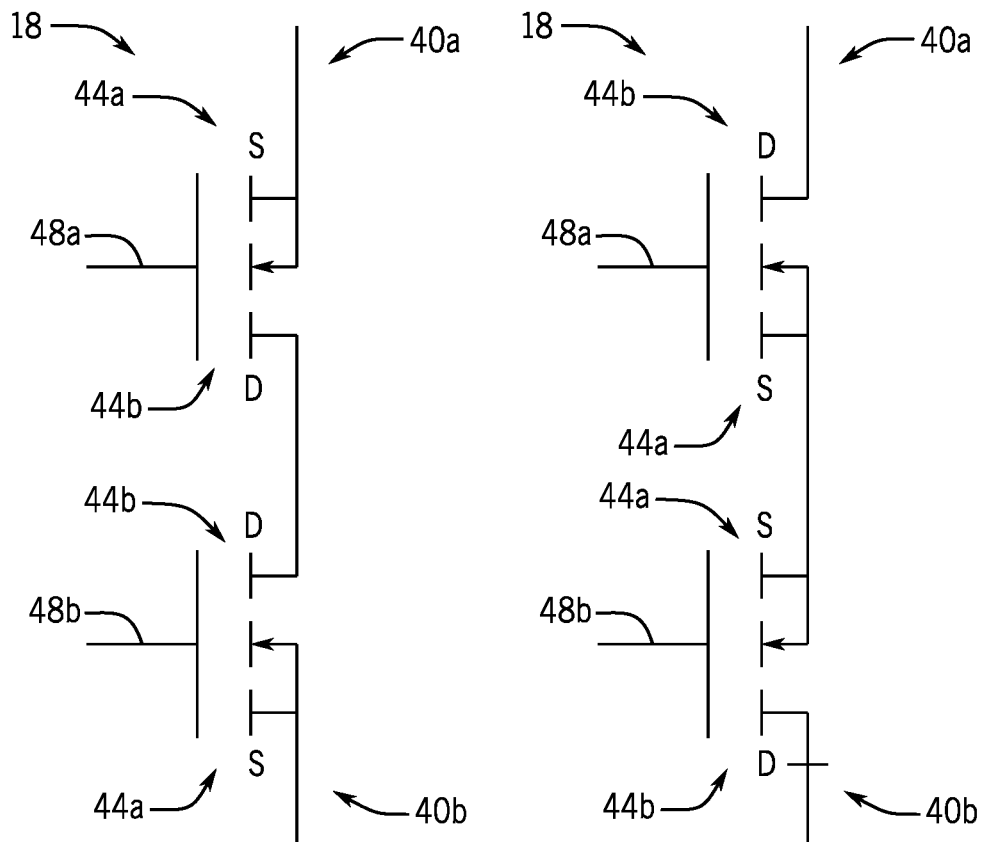
FIGS. 3a and 3b are detailed schematic representations of alternative constructions of the bidirectional semiconductor switches of FIGS. 1 and 2 showing both common source and common drain configurations.

Referring now to FIG. 3a, in one embodiment, the bidirectional semiconductor switches 18 may each provide for a first and second transistor subcomponent 40a and 40b. The first subcomponent 40 is arranged with its source terminal 44a uppermost (as shown) forming one terminal of the bidirectional semiconductor switch 18 and a drain terminal 44b positioned downwardly. This drain terminal 44b is connected to a drain terminal 44b of the second subcomponent 40b providing a common drain configuration. The remaining source terminal 44a of subcomponent 40b forms the second terminal of the bidirectional semiconductor switch 18.

Generally, both subcomponents 40a and 40b may have similar architectures, in this case operating in the manner of enhancement type (normally-off) N-channel MOSFETs.

Referring now to FIG. 3b, in an alternative embodiment, a common source configuration may be used in which the source terminals of the subcomponents 40a and 40b are connected together, involving a rotation of each of these subcomponents 40a and 40b. The common source configuration otherwise operates analogously to the common drain configuration described in FIG. 3.

Figure 5:
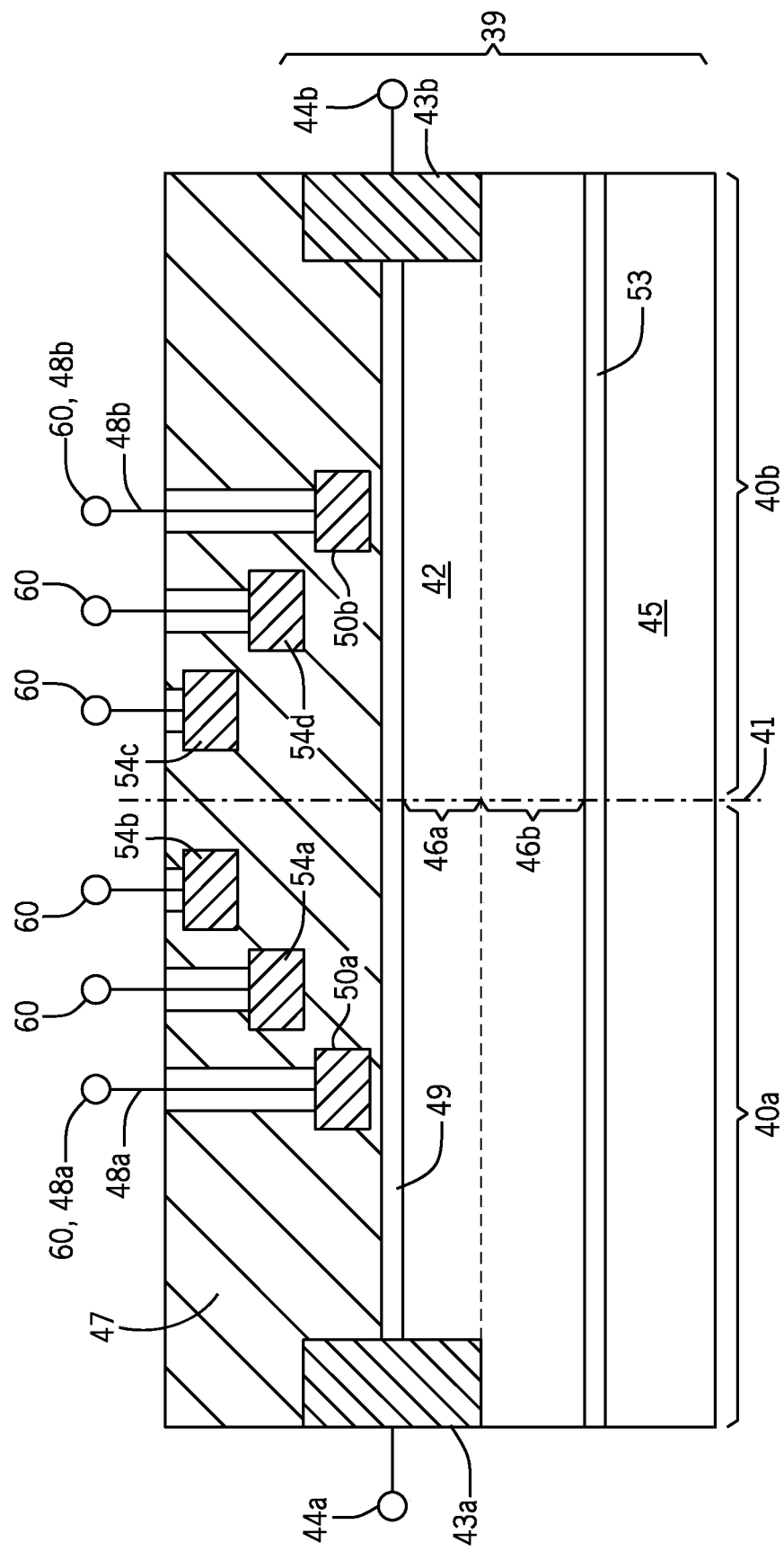
FIG. 5 is a side elevational cross-section of a bidirectional semiconductor switch of FIG. 3a suitable for use in the circuits of FIGS. 1-4 providing a common drain configuration and field plates.
Figure 6:
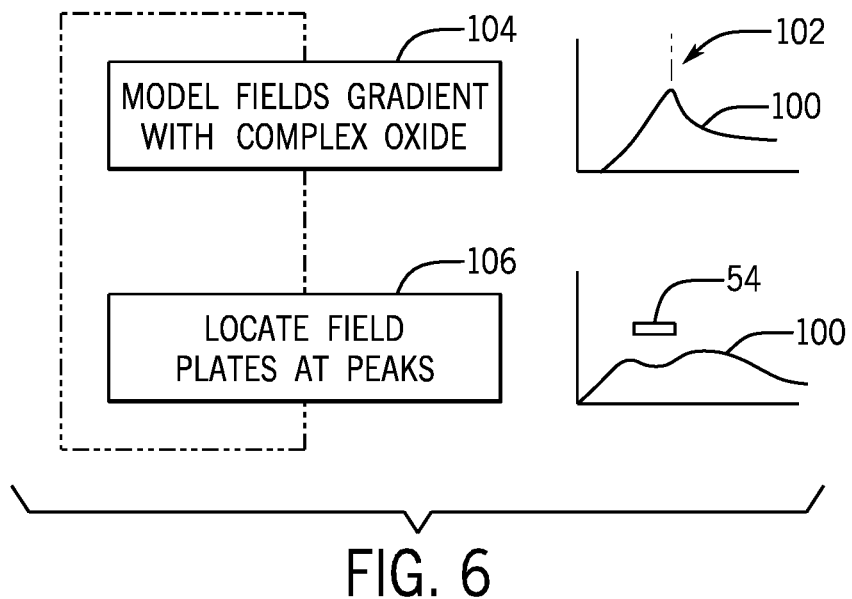
FIG. 6 is a flowchart showing an iterative process for combining field plates with a high dielectric material to reduce device cost

Referring now to FIG. 5, the subcomponents 40a and 40b may be fabricated on a common semiconductor substrate 39 defining a continuous barrier region 42 between a first and second channel electrode 43a and 43b. These channel electrodes 43a and 43b provide the terminals of the bidirectional semiconductor switch 18 (for example, the source terminals 44a in the common drain example) operating either as either inputs or outputs depending on the polarity of voltage applied to the bidirectional semiconductor switch 18. The channel electrodes 43 will generally be a metallic conductive material such as aluminum or copper or a combination of an annealed metal stack such as TiN, Ti/Al/Ni/Au to form ohmic contact. The electrode region may also entail regrowth of heavily doped semiconductor region and electrode deposition on top of it. The electrode region may also entail regrowth of heavily doped semiconductor region and electrode deposition on top of it.

In one embodiment, the barrier region 42 may be a heterojunction between one or more layers 46a and 46b, for example, one layer being aluminum gallium nitride (AlGaN) and the other layer being gallium nitride (GaN). Furthermore, each of these layers 46a and 46b, may itself contain multiple sublayers to provide highly conductive channel region, for example, using thin 0.7 nm AlN/thick 25 nm 25% AlGaN. However, the barrier region 42 will form at the interface of the layers 46a and 46b. More generally, the gallium nitride of each of the layers 46 of the barrier region 42 may be substituted with a material of a form GaX where X is selected from the elements of B, Al, Ga, In, N.

The barrier region 42 may be deposited on a supporting support layer 45, for example, a heterogenous layer (e.g., Si, SiC, Sapphire etc.) or homogenous substrate (e.g., GaN, AlN) and can exhibit multiple polarities. The support layer 45 is isolated from the barrier region 42 by a buffer layer 53 as is generally understood in the art such as Ga-Polar, Al-Polar, N-Polar, Semi-Polar or Non-Polar (m-plane or a-plane) as is generally understood in the art. Buffer layer 53 may also contain multiple layers and doping (Carbon or Iron) to achieve the required effect of "buffer" as commonly understood for power electronic semiconductor GaN HEMT devices.

The barrier region 42 is capped with a dielectric layer 47 providing a dielectric constant of greater than 50. For example, the dielectric layer 47 may be a complex oxide, for example, barium titanate $BaTiO_3$, having a dielectric constant (relative permittivity) of greater than 100 and in one embodiment as high as 280. Alternatively, strontium titanate $SrTiO_3$ may be used having a dielectric constant of greater than 200 and in one embodiment as high as 300. In contrast to a more common FET architecture employing silicon dioxide in layer 47 above the barrier region 42 (silicon dioxide having a relative permittivity of about four) such as accommodates an electrical gradient along the barrier region 42 as high as 100 V per micron, the complex oxide dielectric allows an electrical gradient as high as 280 V per micron and potentially higher. Generally, the electrical gradient increases with the voltage applied to the bidirectional semiconductor or switch 18 and accordingly this higher permissible electrical gradient allows higher voltage ratings for shorter lengths of barrier region 42.

The dielectric layer 47 may be placed on a low or moderate dielectric constant based insulating layer 49, such as $SiO_2$, SiNx, AlOx, transition metal oxides and nitrides, etc. Generally the dielectric constant of this layer will be less than the dielectric layer 47.

Positioned on top of the dielectric layer 47, and thus separated from the barrier region 42 by the dielectric layer 47 and the insulating layer 49, are a first and second gate electrode 50a and 50b positioned between the electrodes 43a and 43b along the barrier region 42 and thus defining the gates 48a and 48b for the subcomponents 40a and 40b, respectively. In one example, the thickness of the dielectric layer 47 will be about 100 nm. Generally, the first and second gate electrodes 50a and 50b will be equal distance from a centerline 41 of the bidirectional semiconductor switch 18 between the electrodes 43a and 43b and hence will be mirror symmetric. The first and second gate electrodes 50a and 50b will also be closer to a closest electrode 43 then to the centerline 41.

In some embodiments, the material of the dielectric layer 47 may fully or partially cover the gate electrode 50 provide structure extending upward from the layer 47 to support one or more field plates 54 positioned on the right side of gate electrode 50a and the left side of gate electrode 50b at different levels. In some embodiments, (not shown), the material of the dielectric layer 47 may fully or partially cover the field plates 54 to moderate the voltage gradient at the edges of the field plates 54. Generally, the field plates 54 will also be conductive metal and will be galvanically isolated from the barrier region 42, the gate electrodes 50, and the electrodes 43.

In one example, left and right field plates 54a and 54d may be positioned closest to the gate electrodes 50a and 50b respectively and between those respective electrodes 50a and 50b and the centerline 41. These field plates 54a and 54d may be elevated with respect to the gate electrode 50 and will also be conductive metals. Elevated slightly above the field plates 54a and 54d and to the right and left of the gate electrode 50a and 50b respectively are the field plates 54b and 54c. During use of the bidirectional semiconductor switch 18, either different ones of these field plates 54 may be active (for example, by connecting it to its associated source electrode 43) depending on the intended operating voltage of the bidirectional semiconductor switch 18.

Figure 4:
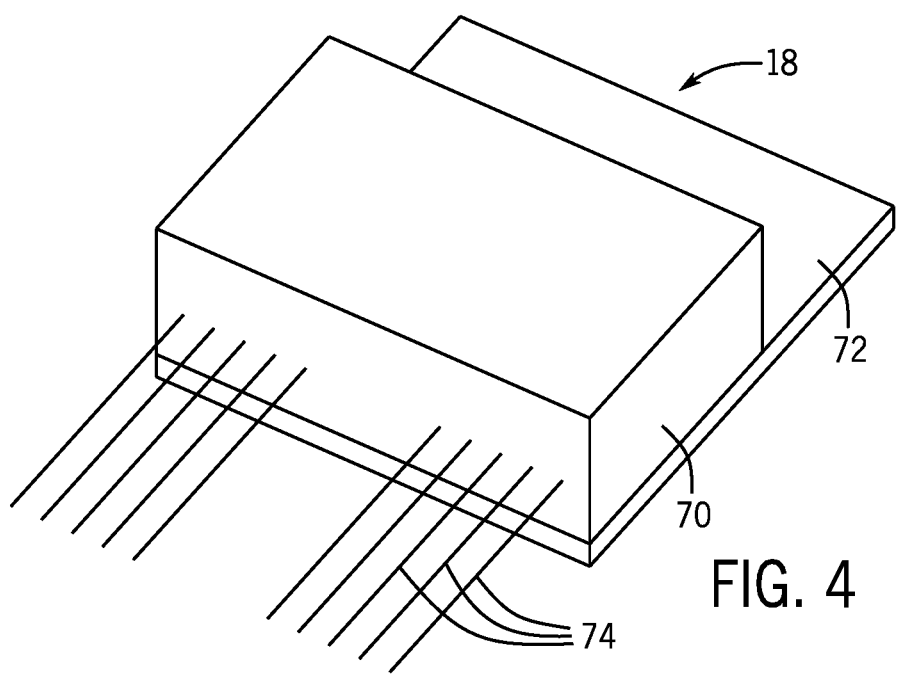
FIG. 4 is a perspective view of the bidirectional semiconductor switch of FIG. 3 in a package showing exposed connection terminals in one embodiment.

Referring to FIG. 4, the electrically active components of the bidirectional semiconductor switch 18 may be encased in a protective housing 70 such as an electrically insulating thermoplastic. In the embodiment where each of the channel electrodes 43, gate electrode 50, and field plates 54 are galvanically isolated within the housing 70, each of the gate electrodes 50 and field plates 54 may have separate terminals 60 allowing independent electrical connection and exposure from the insulating housing 70 by separate conductive leads 74. These individual connections allow the field plates to be selected according to the voltage that will be applied to the bidirectional semiconductor switch 18 or dynamically altered during use.

More generally, it will be understood that the number of conductive leads 74 may be reduced, for example, by internally connecting various of the field plates 54 to a common terminal 60 for each housing 70. In addition some or all of the field plates 54 may be internally connected to the voltages of the source terminal 44a of the respective subcomponents 40.

The invention further contemplates that some or all of the depicted field plates 54 may be omitted relying to a greater extent on the voltage gradient moderating features of the layer 47.

Referring now to FIG. 5, it is anticipated that the placement and size of the field plates 54 may be adjusted according to the presence of the dielectric layer 47, and accordingly the present invention contemplates, in one embodiment, a process in which the electrical field gradient (e.g., volts per micrometer) is modeled as a function of distance along the channel to identify peaks 102 per process block 104 after application of the complex oxide layer 47. This process block 104 is then followed by process block 106 locating and sizing field plates 54 at the peak locations 102 to bring them into acceptable levels for particular anticipated voltage of operation of the bidirectional semiconductor switches 18. These steps may be repeated and iteratively optimized to select the thickness and location of the dielectric layer 47, the particular type of complex oxide selected according to objective functions, minimizing costs, etc.

Figure 7:
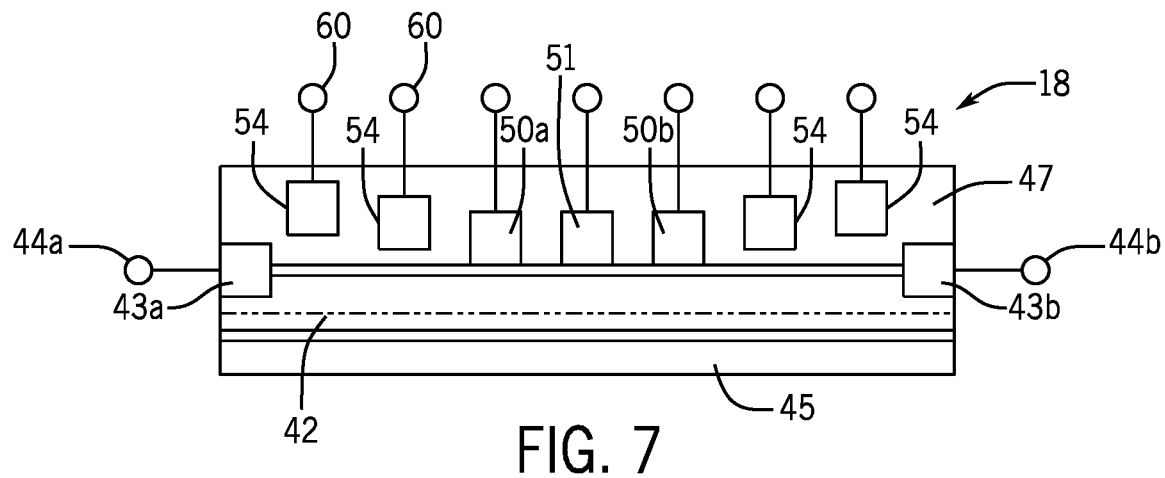
FIG. 7 is a figure similar to FIG. 5 showing a common source configuration providing a source terminal.

Referring now to FIG. 7, the embodiment of FIG. 5 may be modified slightly to be a common source design having a source terminal 51 (providing a voltage reference if needed for driving circuitry) positioned between the gate electrodes 50a and 50b on the centerline 41. Here the field plates 54 for gate electrode 50a are on its left side toward channel electrode 43a and the field plates 54 for the gate electrode 50b are on its right side toward channel electrode 43b. In this configuration the gate electrodes 50a and 50b will be mirror symmetric with respect to each other and closer to the center line 41 then the closest channel electrode 43. Again, each of the field plates 54 gate electrode 50, and channel electrodes 43 and source terminal 51 provide exposed terminal 60 for external connection. The dielectric layer 47 may be placed to surround these elements as discussed with respect to FIG. 5.

Figure 8:
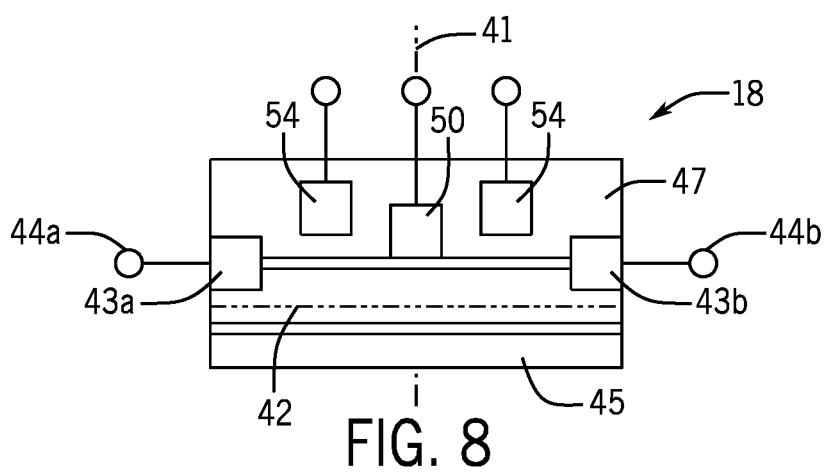
FIG. 8 is a figure similar to that of FIGS. 7 and 5 showing a common gate configuration providing only a single gate terminal in a bidirectional device.

Referring now to FIG. 8, the present invention is also applicable to a common gate design having a single gate electrode 50 at the centerline 41 and thus preserving mirror symmetry with respect to itself. This design may also have left and right flanking field plates 54 (only one shown for clarity but multiple field plates possible). This symmetrical design is suited for bidirectional current flow between channel electrodes 43a and 43b and the total distance between channel electrodes 43a and 43b normally minimized in a unidirectional design by placing the gate electrode 50 close to one of the channel electrodes 43 (depending on the polarity of the device) is minimized through the dielectric layer 47. Again, each of the field plates 54 gate electrodes 50, and channel electrodes 43 and source terminal 51 provide exposed terminal 60 for external connection. The dielectric layer 47 may be placed to surround these elements as discussed with respect to FIG. 5 noting these differences.

As used herein, the term galvanic isolation is intended to refer to conductors that are electrically insulated against long-term DC current flow or ohmic current flow as opposed to capacitive interaction and the like.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom", and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including", and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What we claim is:

1. A bidirectional field-effect transistor comprising:
   a semiconductor channel positioned between device terminals providing current flow laterally through the channel;
   at least one field-effect gate having a gate conductor positioned along the semiconductor channel between the device terminals to control current between the device terminals through the channel by a field effect;
   a dielectric oxide having a dielectric constant of greater than 50 positioned along and adjacent to the channel and laterally beyond edges of the gate conductor of the at least one field-effect gate and operative to moderate field gradients;
   wherein each the at least one field-effect gate is positioned to so that all gates of the bidirectional field-effect transistor are mirror symmetric between the device terminals.

2. The bidirectional field-effect transistor of claim 1, wherein the dielectric oxide is positioned between the at least one field-effect gate and the channel.

3. The bidirectional field-effect transistor of claim 1, including a first and second field-effect gate at equal distance from a centerline between the device terminals.

4. The bidirectional field-effect transistor of claim 3, wherein the first and second field-effect gates are positioned nearer to the device terminals than to the centerline.

5. The bidirectional field-effect transistor of claim 4, further including at least a first and second field plate separated from the channel by the dielectric oxide with the first field plate positioned between the first field-effect gate and the centerline and the second field plate positioned between the second field-effect gate and the centerline.

6. The bidirectional field-effect transistor of claim 5, wherein the field plates are at least partially surrounded by the dielectric oxide.

7. The bidirectional field-effect transistor of claim 5, wherein the bidirectional field-effect transistor is held in an insulating package and wherein each of the first and second field-affect gates, first and second field plates and device terminals communicate electrically through the insulating package to electrically separate external terminals.

8. The bidirectional field-effect transistor of claim 3, wherein the first and second field-effect gates are positioned nearer to the centerline than the device terminals.

9. The bidirectional field-effect transistor of claim 8, further including at least a first and second field plate separated from the channel by the dielectric oxide with the first field plate positioned between the first field-effect gate and its closest device terminal and the second field plate positioned between the second field-effect gate and its closest device terminal.

10. The bidirectional field-effect transistor of claim 9, wherein the field plates are at least partially surrounded by the dielectric oxide.

11. The bidirectional field-effect transistor of claim 9, wherein the bidirectional field-effect transistor is held in an insulating package and wherein each of the first and second field-affect gates, first and second field plates and device terminals communicate electrically through the insulating package to electrically separate external terminals.

12. The bidirectional field-effect transistor of claim 1, providing only a single field-effect gate position symmetrically between the device terminals.

13. The bidirectional field-effect transistor of claim 12, further including at least a first and second field plate separated from the channel by the dielectric oxide with the first and second field plates positioned symmetrically about the single field-effect gate between the device terminals.

14. The bidirectional field-effect transistor of claim 13, wherein the field plates are at least partially surrounded by the dielectric oxide.

15. The bidirectional field-effect transistor of claim 13, wherein the bidirectional field-effect transistor is held in an insulating package and wherein each of the first and second field effect gates, the first and second field plates and the device terminals communicate electrically through the insulating package to electrically separate external terminals.

16. The bidirectional field-effect transistor of claim 13, wherein the bidirectional field-effect transistor is held in an insulating package and wherein each of the first and second field effect gates, the first and second field plates and the device terminals communicate electrically through the insulating package to electrically separate external terminals.

17. The bidirectional field-effect transistor of claim 12, wherein the semiconductor channel supports a voltage difference in excess of 600 V.

18. The bidirectional field-effect transistor of claim 1, wherein the dielectric oxide is selected from the group consisting of: barium titanate and strontium titanate.

19. The bidirectional field-effect transistor of claim 1, wherein the at least one field-effect gate and channel are adapted to allow blocking and conduction of current through the channel during both of two polarities of voltage applied across the channel.

20. An electrical power converter circuit comprising:
   a set of bidirectional field effect transistor semiconductor switches each providing a semiconductor channel positioned between device terminals providing current flow laterally through the channel and at least one field-effect gate having a gate conductor positioned along the semiconductor channel between the device terminals to control current between the device terminals through the channel by a field effect and providing a dielectric oxide having a dielectric constant of greater than 50 positioned along and adjacent to the channel and laterally beyond edges of the gate conductor of the at least one field effect gate and operative to moderate field gradients, wherein each of the at least one field-effect gate is positioned to so that all gates of each bidirectional field-effect transistor are mirror symmetric between the device terminals; and a gate drive circuit providing a gate drive signal to at least one gate of each of the set of bidirectional field effect transistor semiconductor switches, the drive signal dynamically referenced to a different of device terminals depending on a polarity of current flow between the device terminals, the gate drive circuit including semiconductor switches sourcing and sinking current to and from the at least one gate.

\* \* \* \* \*